United States Patent
Scheuerlein et al.

(10) Patent No.: US 6,724,665 B2
(45) Date of Patent: Apr. 20, 2004

(54) MEMORY DEVICE AND METHOD FOR SELECTABLE SUB-ARRAY ACTIVATION

(75) Inventors: Roy E. Scheuerlein, Cupertino, CA (US); Bendik Kleveland, Santa Clara, CA (US)

(73) Assignee: Matrix Semiconductor, Inc., Santa Clara, CA (US)

( * ) Notice: Subject to any disclaimer, the term of this patent is extended or adjusted under 35 U.S.C. 154(b) by 137 days.

(21) Appl. No.: 09/943,655

(22) Filed: Aug. 31, 2001

(65) Prior Publication Data

US 2003/0043643 A1 Mar. 6, 2003

(51) Int. Cl.[7] ................................................. G11C 7/00
(52) U.S. Cl. .............................. 365/189.12; 365/230.03
(58) Field of Search ......................... 365/189.11, 230.03

(56) References Cited

U.S. PATENT DOCUMENTS

| | | | |
|---|---|---|---|
| 3,851,316 A | 11/1974 | Kodama | 340/173 DR |
| 4,592,027 A | 5/1986 | Masaki | 365/203 |
| 4,646,266 A | 2/1987 | Ovshinsky et al. | 365/105 |
| 4,646,269 A | 2/1987 | Wong et al. | 365/230 |
| 4,698,788 A | 10/1987 | Flannagan et al. | 365/205 |
| 4,744,061 A | 5/1988 | Takemae et al. | 365/201 |
| 4,873,669 A | 10/1989 | Furutani et al. | 365/189.01 |
| 5,107,139 A | 4/1992 | Houston et al. | |
| 5,149,199 A | 9/1992 | Kinoshita et al. | 374/178 |
| 5,276,649 A | 1/1994 | Hoshita et al. | 365/206 |
| 5,278,796 A | 1/1994 | Tillinghast et al. | 365/211 |
| 5,359,571 A * | 10/1994 | Yu | 365/185.13 |
| 5,383,157 A | 1/1995 | Phelan | 365/201 |
| 5,410,512 A * | 4/1995 | Takase et al. | 365/230.03 |
| 5,784,328 A | 7/1998 | Irrinki et al. | 365/222 |
| 5,835,396 A | 11/1998 | Zhang | 365/51 |
| 5,890,100 A | 3/1999 | Crayford | 702/130 |
| 5,925,996 A | 7/1999 | Murray | 318/471 |
| 5,940,340 A | 8/1999 | Ware et al. | 365/230.01 |
| 5,961,215 A | 10/1999 | Lee et al. | 374/178 |
| 6,034,882 A | 3/2000 | Johnson et al. | 365/103 |
| 6,034,918 A | 3/2000 | Farmwald et al. | 365/233 |
| 6,055,180 A | 4/2000 | Gudesen et al. | 365/175 |
| 6,070,222 A | 5/2000 | Farmwald et al. | 711/105 |
| 6,185,712 B1 | 2/2001 | Kirihata et al. | 714/732 |
| 6,212,121 B1 | 4/2001 | Ryu et al. | 365/230.03 |
| 6,236,587 B1 | 5/2001 | Gudesen et al. | 365/105 |
| 6,373,768 B2 | 4/2002 | Woo et al. | |
| 6,385,074 B1 | 5/2002 | Johnson et al. | 365/103 |
| 6,560,152 B1 | 5/2003 | Cernea | 365/211 |

OTHER PUBLICATIONS

"A 14ns 1Mb CMOS SRAM with Variable Bit–Organization," Wada et al., 1988 IEEE International Solid–State Circuits Conference, pp. 252–253 (Feb. 19, 1988).

* cited by examiner

Primary Examiner—Michael S. Lebentritt
Assistant Examiner—Tuan T. Nguyen
(74) Attorney, Agent, or Firm—Brinks Hofer Gilson & Lione

(57) ABSTRACT

A memory device and method for selectable sub-array activation. In one preferred embodiment, a memory array is provided comprising a plurality of groups of sub-arrays and circuitry operative to simultaneously write data into and/or read data from a selected number of groups of sub-arrays. By selecting the number of groups of sub-arrays into which data is written and/or from which data is read, the write and/or read data rate is varied. Such varying can be used to prevent thermal run-away of the memory array. Other preferred embodiments are provided, and each of the preferred embodiments can be used alone or in combination with one another.

11 Claims, 5 Drawing Sheets

MEMORY DEVICE AND METHOD FOR SELECTABLE SUB-ARRAY ACTIVATION

BACKGROUND

Passive element memory arrays, such as anti-fuse diode cell arrays, require a high-voltage and high-current programming voltage source due to the large number of leakage paths in the array and the high voltage required to program the element conductivity. The write power dissipation is dominated by the power of the programming voltage source, and the write power increases the temperature of the memory. As the temperature of the diodes increases, the diode leakage current and the write power further increase, and this feedback can cause thermal run-away and failure of the memory. While large sub-arrays are more efficient in area because support circuits are shared by more memory cells, large sub-arrays are usually associated with high leakage current. For example, in high-density anti-fuse diode memory arrays with contiguous memory cell sub-arrays of N-by-N cells stacked in multiple layers, the leakage current increases by $N^2$ as N increases. To reduce the chance of thermal run-away, the memory array can be subdivided into smaller sub-arrays to decrease the number of memory cells that are simultaneously accessed. However, this design can increase the cost per unit of storage capacity and can result in a relatively slow memory device.

There is a need, therefore, for a memory device and method that will avoid thermal run-away while maintaining a relatively low cost and high data rate.

SUMMARY

The present invention is defined by the following claims, and nothing in this section should be taken as a limitation on those claims.

By way of introduction, the preferred embodiments described below provide a memory device and method for selectable sub-array activation. In one preferred embodiment, a memory array is provided comprising a plurality of groups of sub-arrays and circuitry operative to simultaneously write data into and/or read data from a selected number of groups of sub-arrays. By selecting the number of groups of sub-arrays into which data is written and/or from which data is read, the write and/or read data rate is varied. Such varying can be used to prevent thermal run-away of the memory array.

Other preferred embodiments are provided, and each of the preferred embodiments can be used alone or in combination with one another.

The preferred embodiments will now be described with reference to the attached drawings.

BRIEF DESCRIPTION OF THE DRAWINGS

FIG. 4 is an illustration of a memory array of a preferred embodiment in which a temperature sensor is used to vary the number of groups of sub-arrays that can be simultaneously written into or read from.

DETAILED DESCRIPTION OF THE PRESENTLY PREFERRED EMBODIMENTS

Figure 1:
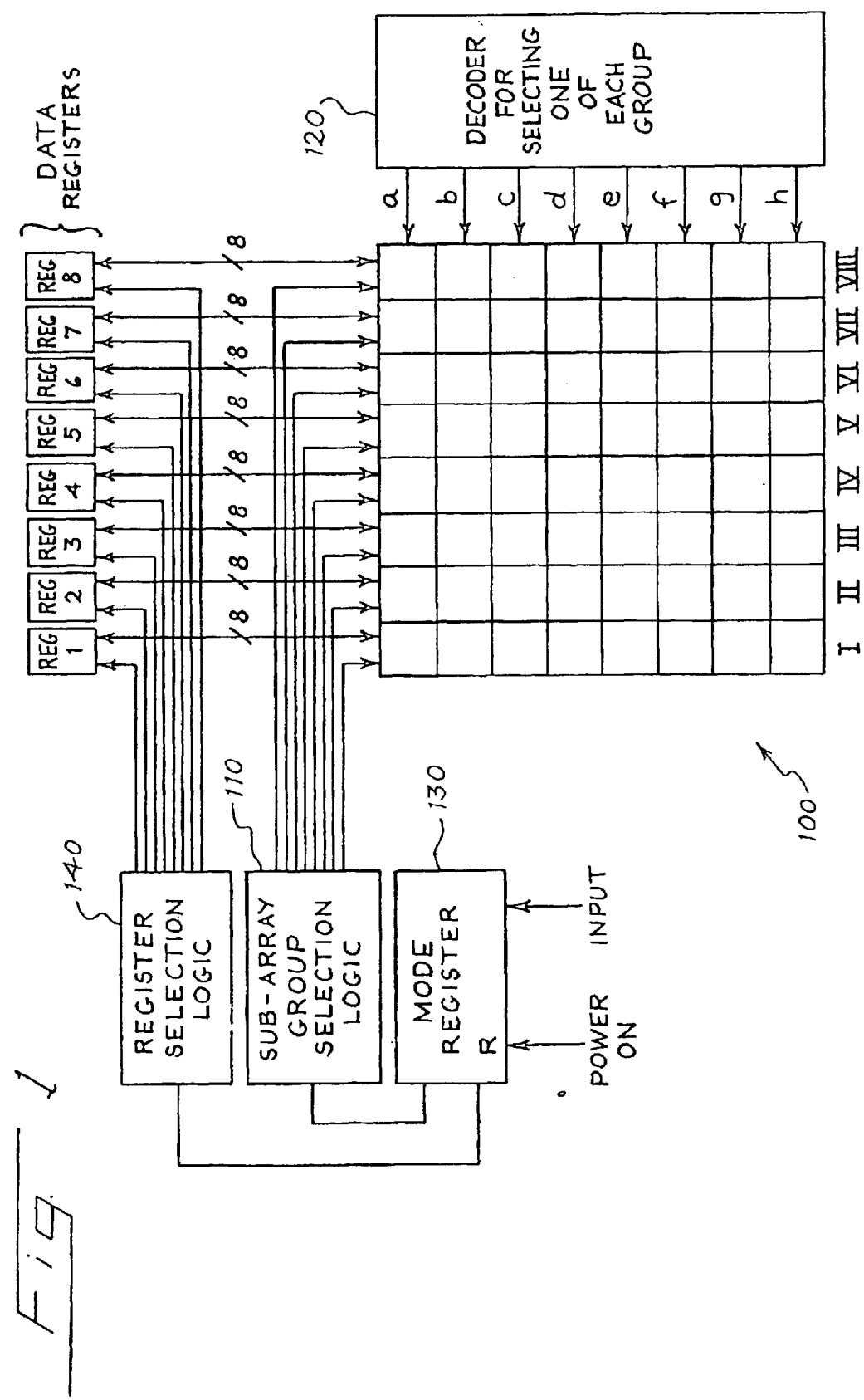
FIG. 1 is an illustration of a memory array of a preferred embodiment in which a plurality of data registers are coupled with a plurality of groups of sub-arrays.

By way of introduction, the maximum data rate sustainable by a memory array before thermal run-away depends on several factors unknown to the circuitry on the chip. For example, if the memory array is wrapped in a thick plastic and housed in an enclosure, the thermal resistance of the packaging can increase the temperature of the memory array. The temperature of the memory array can also increase if the memory array is used in an environment with a high ambient temperature (e.g., in a hot car rather than in an air-conditioned building). Because of these unknown factors, the maximum data rate is often designed to be low enough so that both typical memory arrays and most worst-case memory arrays (e.g., memory arrays with defects, poor heat transfer packaging, or high ambient temperatures) will operate below the thermal run-away temperature. Accordingly, the maximum data rate for a typical memory array is lower than required.

The assignee of the present invention has developed a technique for sensing the temperature state of a memory array and preventing a write and/or read operation to the memory array when the temperature of the memory array reaches a threshold temperature. This technique is described in "Memory Device and Method for Temperature-Based Control over Write and/or Read Operations," U.S. patent application Ser. No. 09/944,613, which is being filed on the same day as the present application and is hereby incorporated by reference. By preventing write and/or read operations only when the memory array is too hot, this technique avoids thermal run-away in worst-case memory arrays while maintaining a high data rate in typical memory arrays. While useful in many applications, this technique can result in a relatively low data rate in applications where write and/or read operations are frequently interrupted due to high operating temperatures.

The preferred embodiments described herein provide another technique that can be used to avoid thermal run-away while maintaining a relatively high data rate. By way of overview, a memory array is provided that comprises a plurality of groups of sub-arrays. As used herein, a sub-array is a contiguous group of memory cells having contiguous word and bit lines generally unbroken by decoders, drivers, sense amplifiers, and input/output circuits. A "group" of sub-arrays can comprise a single sub-array or a plurality of sub-arrays. In these preferred embodiments, the number of sub-array groups that is simultaneously written into is selectable and can vary. For example, the memory array can have a default number of groups of sub-arrays that can be simultaneously written into, and this number can be increased (or decreased) to select a different number of sub-array groups that can be simultaneously written into. Alternatively, an input source (e.g., a host device, a tester, a component in the memory device) can set the number without regard to a default value. By using these preferred embodiments, a higher average data rate (i.e., increased bandwidth) can be achieved in applications where write operations would otherwise be frequently interrupted due to high operating temperatures using the technique described in the above-referenced patent application.

Turning now to the drawings, FIG. 1 is an illustration of a memory array 100 of a preferred embodiment. The memory array 100 is divided into 64 sub-arrays organized into eight groups (Groups I–VIII). Although each sub-array group contains eight sub-arrays in this preferred embodiment, a group of sub-arrays can contain any number of sub-arrays, including a single sub-array. Each sub-array group is coupled with sub-array group selection logic 110, and each row of sub-arrays is coupled with a decoder 120. The sub-array group selection logic 110 is used to select one or more groups of sub-arrays, and the decoder 120 is used to select one sub-array of each of the selected sub-array groups. The sub-array group selection logic 110 is also coupled with a mode register 130. As used herein, the term "register" broadly refers to any circuit that stores an electronic state that can be changed. Each sub-array group is connected to a respective one of eight data registers via a byte-wide data bus. In this preferred embodiment, all of the sub-arrays in a group share a respective data bus. The eight data registers are connected with register selection logic 140, which is also connected to the mode register 130. In this preferred embodiment, the data registers store 512 bytes of information. As used herein, the terms "coupled with" and "connected to" are intended to cover elements that are coupled with or connected to one another either directly or indirectly through one or more named or unnamed intervening components.

In operation, a power-on reset signal is used to set a default value in the mode register 130 provided on the chip. (Instead of the mode register 130 having a default value, the starting value in the mode register 130 can be set by a host device coupled with the memory array 100.) The value in the mode register 130 is provided to the sub-array group selection logic 110 and the register selection logic 140 and represents the number of sub-array groups that are simultaneously written into (i.e., activated/powered-up in parallel during a write operation). The default value can be overwritten in operation by inputs to the mode register 130 (e.g., test signals or application signals). Changing the value in the mode register 130 changes the number of sub-array groups that are simultaneously written into and, therefore, varies the write data rate. Any number of sub-array groups can be used as the default value, and the default value can be set for worst-case (e.g., a default value of one or two) or best-case (e.g., a default value of eight) temperature environments and applications. For backwards compatibility with host devices that do not have the capability to overwrite the value in the mode register 130, it may be preferred to use a low number for the default value to reduce the possibility of thermal run-away.

To illustrate the operation of this preferred embodiment, consider the situation in which the default value in the mode register 130 is two. Based on the value "two" received from the mode register 130, the sub-array group selection logic 110 selects and activates two of the eight sub-array groups (e.g., Groups I and V), and the register selection logic 140 selects two of the eight data registers corresponding to the selected groups of sub-arrays (e.g., Registers 1 and 5). Selection of a sub-array group is described in more detail in "Partial Selection of Passive Element Memory Cell Sub-Arrays for Write Operation," U.S. patent application Ser. No. 09/748,649, which is assigned to the assignee of the present invention and is hereby incorporated by reference.

The data stored in Registers 1 and 5 is then simultaneously written into sub-array Groups I and V. As used herein, the phrase "simultaneously writing data into sub-array groups" means writing data into at least one sub-array of each sub-array group. Although all of the sub-arrays in a group can be written into, it is preferred that fewer than all of the sub-arrays in a group are written into to reduce write power. It is especially preferred that only one sub-array in a group is written into. Data can be written into the sub-arrays of the selected groups in any suitable manner. Preferably, data is written into the same number of sub-arrays in each of the selected groups. In this preferred embodiment, the decoder 120 is used to select a "row" of sub-arrays. Accordingly, data is simultaneously written into sub-array "a" in Groups I and V. In an alternate embodiment, different "rows" of sub-arrays can be selected (e.g., row "a" in Group I and row "b" in Group V). Additionally, data can be written into a sub-array group one bit at a time, or multiple bits can be written simultaneously in one or more sub-arrays. Preferably, a sensing-while-programming technique is used, as described in "Memory Device and Method for Sensing while Programming a Non-Volatile Memory Cell," U.S. patent application Ser. No. 09/896,815, which is assigned to the assignee of the present application and is hereby incorporated by reference. If necessary, writing continues by cycling through other sub-array pairs (i.e., Groups II and VI, Groups III and VII, and Groups IV and VIII) in row a, and then cycling through the sub-array pairs in the other rows in the same fashion. Preferably, all pairs of sub-array groups in one row are used to store one page of data. This is especially preferred if all of the sub-arrays in one row of the memory array are simultaneously read during a read operation, as described in the "Partial Selection of Passive Element Memory Cell Sub-Arrays for Write Operation," U.S. patent application Ser. No. 09/748,649, which is assigned to the assignee of the present invention and is hereby incorporated by reference. Of course, any other writing technique can be used.

For example, writing can continue by cycling through the other sub-arrays in Groups I and V (i.e., sub arrays "b" through "h") and then through other pairs of sub-array groups (i.e., Groups II and VI, Groups III and VII, and Groups IV and VIII). As another example, a single pair of sub-array groups can be used to store one page of data (instead of cycling through the other sub-array groups), and another pair of sub-array groups can be used to store a different page of data.

During use of the memory array 100, the value in the mode register 130 can be changed from its default value to a different value. For example, a host device coupled with the memory device can provide an input to the mode register 130 to change the stored value. If the value is changed from two to four, for example, the sub-array group selection logic 110 would select four of the eight sub-array groups (e.g., Groups I, II, V, and VI), and the register selection logic 140 would select four of the eight data registers corresponding to the four selected sub-array groups (e.g., Registers 1, 2, 5, and 6). Data from Registers 1, 2, 5, and 6 would then be simultaneously written into Groups I, II, V, and VI. Because twice the number of sub-array groups are activated, the data rate is doubled. Similarly, if the value in the mode register 130 were changed to eight, data in each of the eight data registers would be simultaneously written into each of the eight groups of sub-arrays. At the other extreme, if the value in the mode register 130 were changed to one, data from a single data register would be written into a single sub-array group.

Figure 2:
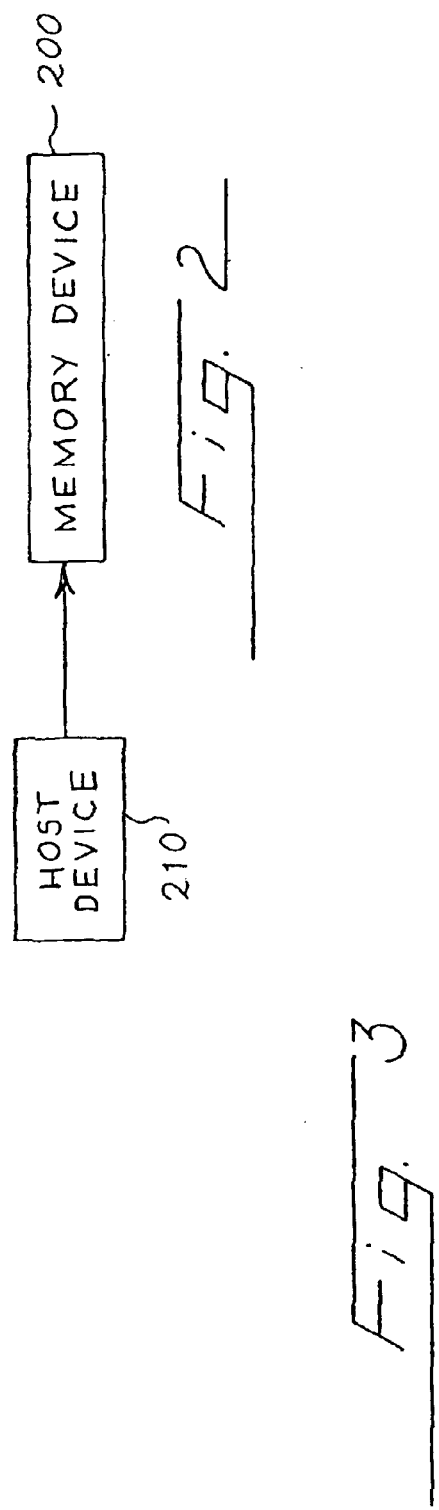
FIG. 2 is an illustration of a host device coupled with a memory device of a preferred embodiment.

The selectable sub-array selection of these preferred embodiments allows many applications to benefit from higher data rates. In one embodiment (shown in FIG. 2), the memory array 100 is part of a memory device 200 that is coupled with a host device 210, such as a digital camera or a digital audio player, that is operative to automatically change the default value set in the mode register 130 based on operating conditions. For example, if the host device 210 has a temperature sensor to measure the ambient temperature, the host device 210 can determine if the memory array is at risk of thermal run-away and adjust the value of the mode register accordingly. In this way, if the host device 210 is used in an air-conditioned building, the host device 210 selects a higher data rate than when the host device is used in a hot automobile. The host device 210 can also select a higher data rate if the host device 210 has a good cooling system.

As another example, if the host device 210 senses that its supply current capability is low (e.g., its battery is weak), the host device 210 can automatically set a lower value in the mode register 130 to decrease the number of groups that are simultaneously written into, thereby saving power. Additionally, if the average rate at which the host device 210 writes data to the memory array 100 is relatively low, such as when a user waits several minutes (or hours) between taking pictures with a digital camera, a higher data rate can be used because the time between write operations allows the memory array 100 to stay cool. In this situation, the host device 210 can automatically set a higher value in the mode register 130 to increase the number of sub-array groups that are simultaneously written into, thereby increasing the data rate. In addition to or instead of the host device 210 automatically setting the value in the mode register 130, a user of the host device 210 can manually set the value. For example, a user can press a power-savings button on the host device 210 to reduce the write data rate in order to draw less power from the host device's battery.

Figure 3:
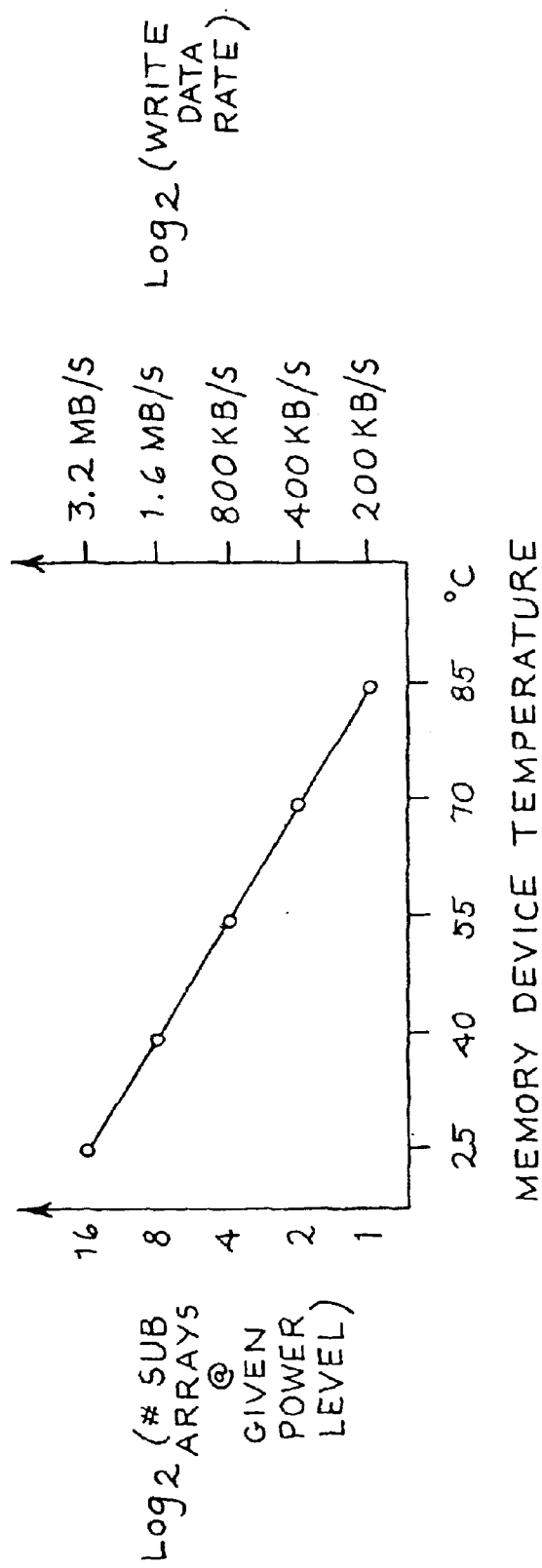
FIG. 3 is a graph of selected groups of sub-arrays and write data rate versus memory device temperature.

When the memory array is used in a host device 210, the memory array 100 is packaged in the memory device 200 and is considered to be used "in the field" and in "user mode." In contrast, when the memory array is used in test mode, the memory array is not packaged in a memory device. Additionally, if the memory array takes the form of a write-once memory array, user data is written into a user-accessible portion of the memory array when used in the field, whereas test data is written into specially-designated testing regions of the memory array during testing mode. In addition to using these preferred embodiments "in the field," these preferred embodiments can also be used when the memory array is tested during the production process. During testing, the memory array is typically placed in a cool, well-controlled environment. Because of the cool ambient conditions, the default value in the mode register 130 can be increased so that the memory array 100 can be tested as quickly as possible. As shown in the graph of FIG. 3, if the memory array 100 is being testing at a temperature of 40° C. or less, a 1.6 MB/sec write data rate is sustainable. Accordingly, the value in the mode register 130 can be increased from two to eight. The memory can be designed so that the mode register 130 is only accessible during manufacturing so that the value in the mode register 130 is not changeable by the host device 210 or by a user.

Figure 4:
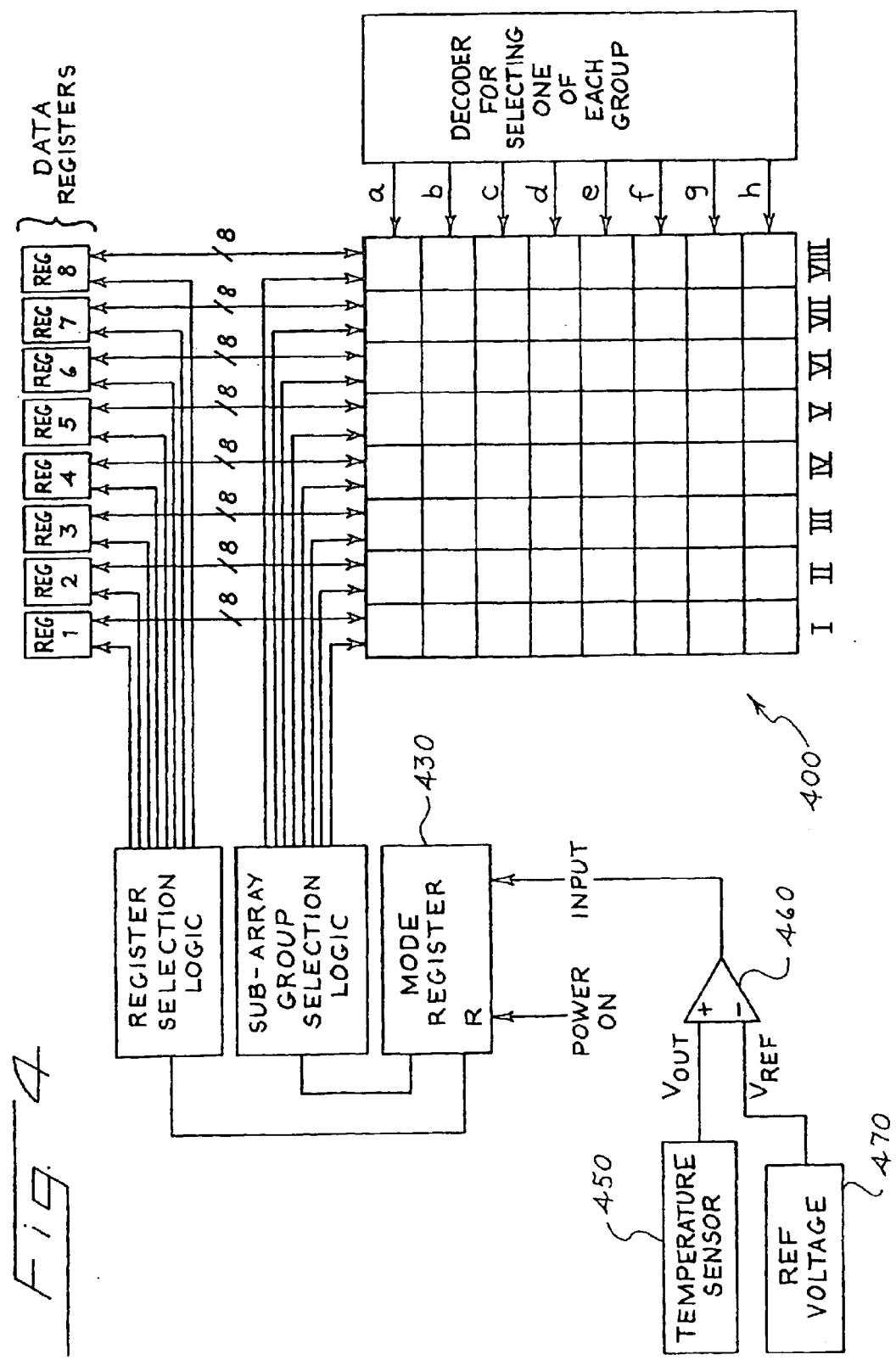

In the examples above, the input to the mode register was provided by a source external to the memory device (e.g., by a host device, user, or tester). In another embodiment, the input to the mode register is provided by a source internal to the memory device. For example, as shown in FIG. 4, the input to the mode register 430 can be the output of temperature-based control circuitry internal to the memory device. In operation, a temperature sensor 450 senses the temperature of the memory array 400, and a comparator 460 compares the output of the temperature sensor 450 ($V_{out}$) to a reference voltage from a reference voltage source 470 ($V_{ref}$). When the temperature of the memory array 400 reaches a threshold temperature, the comparator 460 provides an input to the mode register 430 to decrease the value in the mode register 430 to the next fewer number of selected sub-array groups. In one preferred embodiment, after the comparator 460 decreases the value in the mode register 430, at least one more write operation is permitted. If the temperature still exceeds the threshold temperature, an additional decrease occurs with each initiation of a block write operation. Decreasing the value in the mode register 430 below the lowest number of sub-array groups preferably activates the signal that prevents the start of a block write operation, as described in "Memory Device and Method for Temperature-Based Control over Write and/or Read Operations," U.S. patent application Ser. No. 09/944,613, which is being filed on the same day as the present application and is hereby incorporated by reference. In addition to providing an input to the mode register 430, the same or another temperature control circuit can be used to implement the thermal cut-off techniques described in the above-referenced patent application to protect the memory array 400 from functionality failure at high temperature.

There are several alternatives that can be used with these preferred embodiments.

Figure 5:
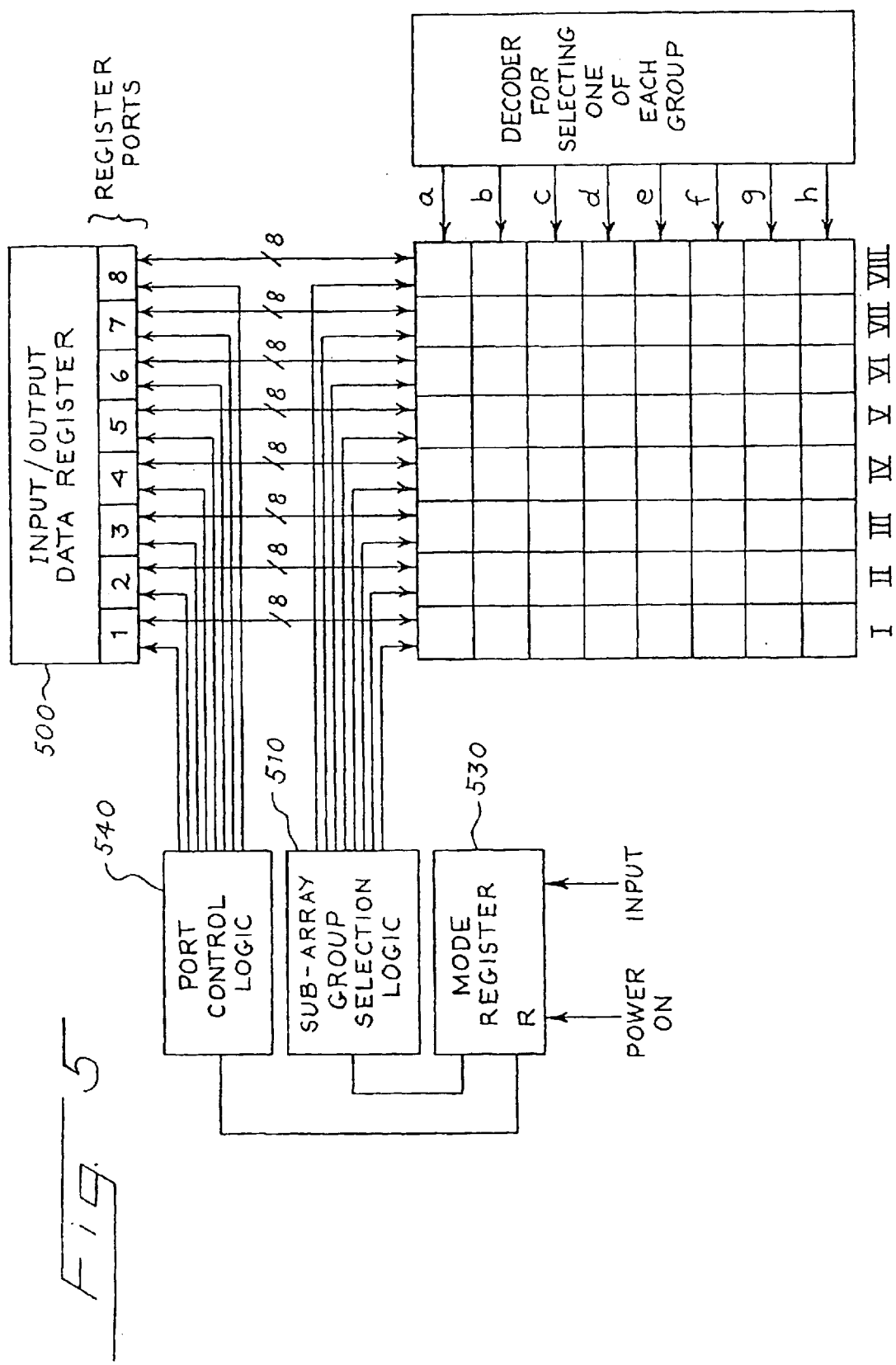
FIG. 5 is an illustration of a memory array of a preferred embodiment in which a plurality of register ports of a data register are coupled with a plurality of groups of sub-arrays.

For example, instead of using a data register partitioned into eight separate registers as in FIG. 1, a single input/output data register 500 can be used, as shown in FIG. 5. In this alternate embodiment, the data register 500 has eight separate register ports, each connected to a respective sub-array group via respective data busses. The register selection logic 140 of FIG. 1 is replaced by port control logic 540. The number of register ports and sub-array groups that are active at one time is controlled by the value in the mode register 530. Specifically, the value in the mode register 530 determines how many sub-array groups are activated by the sub-array group selection logic 510 and also determines how many register ports in the data register 500 are activated by the port control logic 540. The operation of this alternate embodiment is similar to that of the embodiment shown in FIG. 1.

Figure 6:
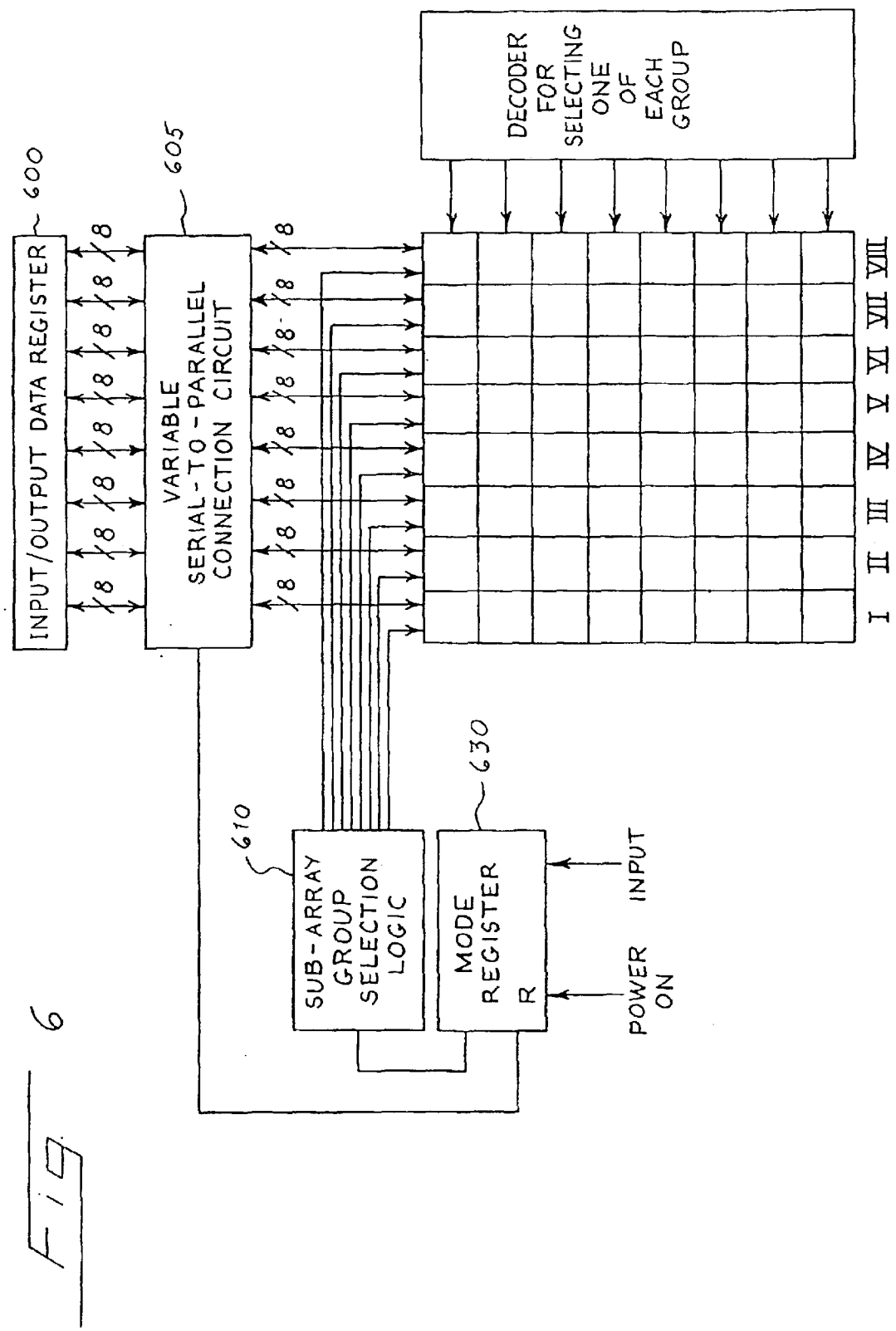
FIG. 6 is an illustration of a memory array of a preferred embodiment in which a data register is coupled with a plurality of groups of sub-arrays through a variable serial-to-parallel connection circuit.

In another alternate embodiment shown in FIG. 6, an input/output data register 600 is connected to the controlling inputs of a variable serial-to-parallel connection circuit 605 via eight byte-wide data busses. The connection circuit 605 provides a path from the data register 600 (which can contain, for example, 512 bytes of information) to the memory array (which can contain, for example, 2 more bytes of information). Each sub-array group has a byte-wide data bus connected to the connection circuit 605. The variable serial-to-parallel connection circuit 605 changes from one to eight parallel paths to the memory array. In this embodiment, the change in serial-to-parallel mapping is preferably a power of two for simplicity in logic design; however, a non-power-of-two change in mapping can be used. Preferably, the ECC bits for a write operation are calculated before the data is stored in the data register 600. The ECC word size and location of ECC bits is then independent of the change in the serial-to-parallel mapping.

When the value in the mode register 630 is two, for example, the eight parallel byte-wide busses from the data register 600 to the connection circuit 605 are considered to be in two groups of four. One group of four is sequentially connected to a data bus connected to one sub-array group (e.g., Group I), which is cycled through four write-operations as the data is sequenced onto the array bus. Similarly, a second sub-array group (e.g., Group V) receives data from the other group of four data busses from the data register 600. When the value in the mode register 630 is changed to four, for example, the connection circuit 605 forms four groups of busses, each containing two byte-wide busses, and two bytes of information are stored in a selected sub-array group. Three other selected sub-array groups simultaneously store their associated two bytes of data so that the data rate is doubled. When the value in the mode register 630 is eight, the connection circuit 605 has eight simultaneous paths to eight array busses so that all eight bytes are written in parallel for a higher data rate. In the other extreme, when the value in the mode register 630 is one, all of the busses from the data register 600 are in one group and are sequentially passed to just one selected sub-array group.

In another alternative embodiment, the default value in the mode register is mask programmable. By using a mask programmable power-on reset state, a higher default value in the mode register can be set as future production advances improve the leakage characteristics of memory cells. For example, the default value in the mode register can be set low (e.g., one or two) for worst-case operating conditions, and as future production advances improve the leakage characteristics of memory cells, a higher default value (e.g., four or eight) can be mask programmed in the mode register. In yet another alternative embodiment, instead of the number of sub-array groups being stored in a register in the memory device, hardware or software in the host device can be solely responsible for selecting a number of groups of sub-arrays that are simultaneously written into. Any other suitable substitute for the register can be used. For example, the value representing the number of groups of sub-arrays into which data will be simultaneously written can be stored in the memory array itself or in a host device. Accordingly, the use of a register should not be read into the claims unless explicitly recited.

Instead of or in addition to varying the number of sub-array groups that is simultaneously written into, the number of sub-array groups that is simultaneously read from can be varied. High read power can occur when many sub-arrays are selected simultaneously for high data rate. In antifuse diode memory arrays during read operations, the voltage across the leakage path reverse-biased diodes can be about 1.5 to 2.5 volts. Accordingly, the read mode leakage is less than the write mode leakage per sub-array. However, increasing the read mode data rate by selecting 64, 128, or more sub-arrays (versus selecting 2 to 8 sub-arrays for write) can lead to read powers that can cause overheating. To prevent overheating, the number of sub-array groups that are simultaneously read from can be varied by selecting a number of groups of sub-arrays from which data will be simultaneously read. The operation of this embodiment is similar to those illustrated above with respect to the write operation. The same or a different mode register as that used for the write operation can be used.

With any of these preferred embodiments, it is preferred that the memory array comprise a plurality of non-volatile passive element memory cells. A passive element memory cell is generally a two-terminal memory cell having a steering element in series with a state change element, together connected between one of M possible X-lines (i.e., word lines) and one of N possible Y-lines (i.e., bit lines). These two elements within a memory cell may both be present before programming. Alternatively, the steering element within a given memory cell may be formed during programming of the memory cell. Suitable state change elements include those having a significant change of resistance, including both fuses and antifuses. A memory cell whose state change element is an antifuse may be termed an antifuse memory cell, whereas a memory cell whose state change element is a fuse may be termed a fuse memory cell. Other passive element memory cells incorporate layers of organic materials including at least one layer that has a diode-like characteristic conduction and at least one organic material that changes conductivity with the application of an electric field. U.S. Pat. No. 6,055,180 to Gudensen et al. describes organic passive element arrays and is hereby incorporated by reference. Memory cells comprising materials such as phase-change materials and amorphous solids can also be used. See U.S. Pat. No. 5,751,012 to Wolstenholme et al. and U.S. Pat. No. 4,646,266 to Ovshinsky et al., both of which are hereby incorporated by reference.

These preferred embodiments provide particular advantage to high density memory arrays that use diode selection devices and apply high voltages to write to the array. As described above, although any suitable type of memory cell can be used, in one preferred embodiment, the memory cell comprises an antifuse and a diode. In its un-programmed state, the antifuse is intact, and the memory cell holds a Logic 1. When suitable voltages are applied to the appropriate wordline and bitline, the antifuse of the memory cell is blown, and the diode is connected between the wordline and the bitline.

This places the memory cell in a programmed (Logic 0) state. Alternatively, the un-programmed state of the memory cell can be Logic 0, and the programmed state can be Logic 1. Memory cells that support multiple programmed states can also be used. While write-many memory cells can be used, it is preferred that the memory cells be write-once memory cells. In a write-once memory cell, an original, un-programmed digital state of the memory cell (e.g., the Logic 1 state) cannot be restored once switched to a programmed digital state (e.g., the Logic 0 state). The memory cells can be made from any suitable material. As described above, the memory cells are preferably made from a semiconductor material; however, other materials such as phase-change materials and amorphous solids as well as those used with MRAM and organic passive element arrays can be used, as described in U.S. Pat. No. 6,055,180, which is hereby incorporated by reference.

Although any suitable memory array can be used, the memory array is preferably a three-dimensional memory array, which provides important economies in terms of reduced size and associated reductions in manufacturing cost. Suitable types of three-dimensional memory arrays are described in U.S. Pat. No. 6,034,882 to Johnson et al., U.S. Pat. No. 5,835,396 to Zhang, and U.S. patent application Ser. No. 09/560,626, all of which are hereby incorporated by reference. Additionally, in one preferred embodiment, the memory device takes the form of a compact, modular memory device that can be used with portable consumer products such as digital cameras, and the memory array of such a memory device is field-programmable, allowing the memory array to be programmed at a time after fabrication.

Each of the following patent documents is hereby incorporated by reference: "Multi-Stage Charge Pump," U.S. patent application Ser. No. 09/809,878; "Method and Apparatus for Writing Memory Arrays Using External Source of High Programming Voltage," U.S. patent application Ser. No. 09/897,785; "Method and Apparatus for Biasing Selected and Unselected Array Lines when Writing a Memory Array," U.S. patent application Ser. No. 09/897,771; and "Partial Selection of Passive Element Memory Cell Sub-Arrays for Write Operation," U.S. patent application Ser. No. 09/748,649.

It is intended that the foregoing detailed description be understood as an illustration of selected forms that the invention can take and not as a definition of the invention. It is only the following claims, including all equivalents, that are intended to define the scope of this invention. Finally, it should be noted that any aspect of any of the preferred embodiments described herein can be used alone or in combination with one another.

What is claimed is:

1. A memory device comprising:

a memory array comprising a plurality of groups of sub-arrays;

a register; and circuitry operative to simultaneously write data into N number of groups of sub-arrays, wherein N is a value stored in the register.

2. The invention of claim 1, wherein N is a default value for the register.

3. The invention of claim 1, wherein the memory device is coupled with a host device, and wherein N is stored in the register by the host device.

4. The invention of claim 1 further comprising temperature-based control circuitry coupled with the register, and wherein N is stored in the register by the temperature-based control circuitry.

5. The invention of claim 1 further comprising:

a plurality of data registers coupled with the plurality of groups of sub-arrays;

register selection logic coupled with the plurality of data registers and the register; and sub-array group selection logic coupled with the plurality of groups of sub-arrays and the register.

6. The invention of claim 1 further comprising:

a data register comprising a plurality of register ports coupled with the plurality of groups of sub-arrays;

port control logic coupled with the plurality of registers ports and the register; and sub-array group selection logic coupled with the plurality of groups of sub-arrays and the register.

7. The invention of claim 1 further comprising:

a data register;

a variable serial-to-parallel connection circuit, the variable serial-to-parallel connection circuit coupled with the register and coupling the data register to the plurality of groups of sub-arrays; and sub-array group selection logic coupled with the plurality of groups of sub-arrays and the register.

8. The invention of claim 1, wherein the memory array comprises a three-dimensional memory array.

9. The invention of claim 1, wherein the memory array comprises a plurality of antifuse memory cells.

10. The invention of claim 1, wherein the memory array comprises a plurality of write-once memory cells.

11. The invention of claim 1, wherein the memory array comprises a plurality of write-many memory cells.

* * * * *